United States Patent
Farris, III

(10) Patent No.: US 8,440,903 B1
(45) Date of Patent: May 14, 2013

(54) METHOD AND STRUCTURE FOR FORMING MODULE USING A POWDER COATING AND THERMAL TREATMENT PROCESS

(75) Inventor: Chester A. Farris, III, Yorba Linda, CA (US)

(73) Assignee: Stion Corporation, San Jose, CA (US)

( * ) Notice: Subject to any disclaimer, the term of this patent is extended or adjusted under 35 U.S.C. 154(b) by 554 days.

(21) Appl. No.: 12/372,722

(22) Filed: Feb. 17, 2009

Related U.S. Application Data

(60) Provisional application No. 61/030,552, filed on Feb. 21, 2008.

(51) Int. Cl.
- *H02N 6/00* (2006.01)
- *H01L 31/042* (2006.01)
- *H01L 21/00* (2006.01)

(52) U.S. Cl.
USPC .............................. 136/251; 438/57; 438/64

(58) Field of Classification Search .................. None
See application file for complete search history.

(56) References Cited

U.S. PATENT DOCUMENTS

| | | |
|---|---|---|
| 4,335,266 A | 6/1982 | Mickelsen et al. |
| 4,441,113 A | 4/1984 | Madan |
| 4,461,922 A | 7/1984 | Gay et al. |
| 4,465,575 A | 8/1984 | Love et al. |
| 4,471,155 A | 9/1984 | Mohr et al. |
| 4,499,658 A | 2/1985 | Lewis |
| 4,507,181 A | 3/1985 | Nath et al. |
| 4,517,403 A | 5/1985 | Morel et al. |
| 4,532,372 A | 7/1985 | Nath et al. |
| 4,542,255 A | 9/1985 | Tanner et al. |
| 4,581,108 A | 4/1986 | Kapur et al. |
| 4,589,194 A | 5/1986 | Roy |
| 4,589,918 A | 5/1986 | Nishida |
| 4,598,306 A | 7/1986 | Nath et al. |

(Continued)

FOREIGN PATENT DOCUMENTS

| | | |
|---|---|---|
| AU | 734676 | 2/1999 |
| DE | 3314197 A1 | 3/1983 |

(Continued)

OTHER PUBLICATIONS

Chopra et al., "Thin-Film Solar Cells: An Overview," 2004, Progress in Photovoltaics: Research and Applications, 2004, vol. 12, pp. 69-92. (abstract) [online}. Retrieved from the internet on Nov. 13, 2008. Retrieved from:<URL: http://www3.interscience.wiley.com/.

(Continued)

*Primary Examiner* — Jennifer Michener
*Assistant Examiner* — Christopher Danicic
(74) *Attorney, Agent, or Firm* — Kilpatrick Townsend & Stockton LLP

(57) ABSTRACT

The present invention provides a solar module formed using a powder coating and thermal treatment process. The solar module includes a substrate having a surface region and a photovoltaic material overlying the surface region. The solar module further includes a barrier material overlying the photovoltaic material. Moreover, the solar module includes a coating overlying the barrier material and enclosing the photovoltaic material to mechanically protect the photovoltaic material. In certain embodiments, photovoltaic material is a thin film photovoltaic cell and the coating is provided by a powder coating substantially free of bubbles formed by electrostatic spraying and cured with a thermal treatment process.

8 Claims, 5 Drawing Sheets

U.S. PATENT DOCUMENTS

| | | | |
|---|---|---|---|
| 4,599,154 | A | 7/1986 | Bender et al. |
| 4,611,091 | A | 9/1986 | Choudary et al. |
| 4,612,411 | A | 9/1986 | Wieting et al. |
| 4,623,601 | A | 11/1986 | Lewis et al. |
| 4,625,070 | A | 11/1986 | Berman et al. |
| 4,638,111 | A | 1/1987 | Gay |
| 4,661,370 | A | 4/1987 | Tarrant |
| 4,663,495 | A | 5/1987 | Berman et al. |
| 4,710,589 | A | 12/1987 | Meyers et al. |
| 4,724,011 | A | 2/1988 | Turner et al. |
| 4,751,149 | A | 6/1988 | Vijayakumar et al. |
| 4,775,425 | A | 10/1988 | Guha et al. |
| 4,798,660 | A | 1/1989 | Ermer et al. |
| 4,816,082 | A | 3/1989 | Guha et al. |
| 4,914,042 | A | 4/1990 | Mahan |
| 4,915,745 | A | 4/1990 | Pollock et al. |
| 4,950,615 | A | 8/1990 | Basol et al. |
| 4,996,108 | A | 2/1991 | Divigalpitiya et al. |
| 5,008,062 | A | 4/1991 | Anderson et al. |
| 5,028,274 | A | 7/1991 | Basol et al. |
| 5,029,760 | A | 7/1991 | Gamblin |
| 5,039,353 | A | 8/1991 | Schmitt |
| 5,045,409 | A | 9/1991 | Eberspacher et al. |
| 5,069,868 | A | 12/1991 | Tokiai et al. |
| 5,078,803 | A | 1/1992 | Pier et al. |
| 5,125,984 | A | 6/1992 | Kruehler et al. |
| 5,133,809 | A | 7/1992 | Sichanugrist et al. |
| 5,137,835 | A | 8/1992 | Karg |
| 5,180,686 | A | 1/1993 | Banerjee et al. |
| 5,211,824 | A | 5/1993 | Knapp |
| 5,231,047 | A | 7/1993 | Oyshinsky et al. |
| 5,248,345 | A | 9/1993 | Sichanugrist et al. |
| 5,261,968 | A | 11/1993 | Jordan |
| 5,298,086 | A | 3/1994 | Guha et al. |
| 5,336,623 | A | 8/1994 | Sichanugrist et al. |
| 5,346,853 | A | 9/1994 | Guha et al. |
| 5,389,159 | A * | 2/1995 | Kataoka et al. ............... 136/251 |
| 5,474,939 | A | 12/1995 | Pollock et al. |
| 5,501,744 | A | 3/1996 | Albright et al. |
| 5,512,107 | A | 4/1996 | Van den Berg |
| 5,536,333 | A | 7/1996 | Foote et al. |
| 5,665,175 | A | 9/1997 | Safir |
| 5,977,476 | A | 11/1999 | Guha et al. |
| 6,066,797 | A | 5/2000 | Toyomura et al. |
| 6,166,319 | A | 12/2000 | Matsuyama |
| 6,288,415 | B1 | 9/2001 | Leong et al. |
| 6,294,274 | B1 | 9/2001 | Kawazoe |
| 6,294,722 | B1 * | 9/2001 | Kondo et al. ............... 136/244 |
| 6,328,871 | B1 | 12/2001 | Ding et al. |
| 6,784,492 | B1 | 8/2004 | Morishita et al. |
| 6,852,920 | B2 | 2/2005 | Sager et al. |
| 6,878,871 | B2 | 4/2005 | Scher et al. |
| 7,180,101 | B2 | 2/2007 | Ouchi |
| 7,265,047 | B2 | 9/2007 | Lee |
| 7,855,089 | B2 | 12/2010 | Farris, III et al. |
| 2002/0026955 | A1 | 3/2002 | Ouchida et al. |
| 2002/0063065 | A1 | 5/2002 | Sonoda |
| 2003/0075717 | A1 | 4/2003 | Kondo et al. |
| 2004/0063320 | A1 | 4/2004 | Hollars |
| 2004/0095658 | A1 | 5/2004 | Buretea et al. |
| 2004/0110393 | A1 | 6/2004 | Munzer et al. |
| 2004/0203220 | A1 | 10/2004 | Morooka et al. |
| 2004/0244826 | A1 | 12/2004 | Takagi |
| 2004/0245912 | A1 | 12/2004 | Thurk et al. |
| 2004/0252488 | A1 | 12/2004 | Thurk |
| 2005/0109392 | A1 | 5/2005 | Hollars |
| 2005/0164432 | A1 | 7/2005 | Lieber et al. |
| 2005/0257824 | A1 * | 11/2005 | Maltby et al. ............... 136/252 |
| 2005/0287717 | A1 | 12/2005 | Heald et al. |
| 2006/0002838 | A1 | 1/2006 | Oda |
| 2006/0003585 | A1 | 1/2006 | Morooka |
| 2006/0034065 | A1 | 2/2006 | Thurk |
| 2006/0040103 | A1 | 2/2006 | Whiteford et al. |
| 2006/0051505 | A1 | 3/2006 | Kortshagen et al. |
| 2006/0053969 | A1 | 3/2006 | Harada |
| 2006/0173113 | A1 * | 8/2006 | Yabuta et al. ............... 524/439 |
| 2006/0196535 | A1 * | 9/2006 | Swanson et al. ............... 136/244 |
| 2006/0220059 | A1 | 10/2006 | Satoh et al. |
| 2007/0006914 | A1 | 1/2007 | Lee |
| 2007/0089782 | A1 | 4/2007 | Scheuten et al. |
| 2007/0151596 | A1 | 7/2007 | Nasuno et al. |
| 2007/0169810 | A1 | 7/2007 | Van Duren et al. |
| 2008/0041446 | A1 | 2/2008 | Wu et al. |
| 2008/0092945 | A1 | 4/2008 | Munteanu et al. |
| 2008/0092953 | A1 | 4/2008 | Lee |
| 2008/0216885 | A1 | 9/2008 | Frolov et al. |
| 2009/0058295 | A1 * | 3/2009 | Auday et al. ............... 313/581 |

FOREIGN PATENT DOCUMENTS

| | | |
|---|---|---|
| DE | 10104726 A1 | 8/2002 |
| FR | 2646560 | 11/1990 |
| GB | 2124826 A | 2/1984 |
| GB | 2332684 A | 6/1999 |
| JP | 2000/173969 | 6/2000 |
| JP | 2000/219512 | 8/2000 |
| JP | 2002/167695 | 6/2002 |
| JP | 2002/270871 | 9/2002 |
| JP | 2004/332043 | 11/2004 |
| JP | 2005/311292 | 11/2005 |
| WO | WO 2005011002 | 2/2005 |
| WO | WO2007023237 * | 3/2007 |

OTHER PUBLICATIONS

Ellmer et al., Copper indium disulfide solar cell absorbers prepared in a one-step process by reactive magnetron sputtering from copper and indium targets. Thin Solid Films 413 (2002) 92-97, [online] [retrieved Jul. 20, 2009 (Jul. 21, 2009)]. Retrieved from the Internet: URL<http://www.sciencedirect.com/science.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of ZnxCd1_xS Nanocomposites in Polymer Matrices and their Photophysical Properties, Langmuir 1998, 14, pp. 4342-4344.

International Search Report and Written Opinion of PCT Application No. PCT/US08/76908, date of mailing Dec. 1, 2008, 8 pages total.

International Search Report and Written Opinion of PCT Application No. PCT/US2008/78001, date of mailing Dec. 2, 2008, 7 pages total.

International Search Report & Written Opinion of PCT Application No. PCT/US 09/46161, date of mailing Jul. 27, 2009, 14 pages total.

International Search Report & Written Opinion of PCT Application No. PCT/US 09/46802, mailed on Jul. 31, 2009, 11 pages total.

Onuma et al., Preparation and characterization of CuInS thin films solar cells with large grain, Solar Energy Materials & Solar Cells 69 (2001) 261-269, [online] [retrieved Jul. 20, 2009 (Jul. 21, 2009)]. Retrieved from the Internet: URL<http://www.sciencedirect.com/science.

Yang et al., Fabrication and Characteristics of ZnS Nanocrystals/ Polymer Composite Doped with Tetraphenylbenzidine Single Layer Structure Light-emitting Diode, Applied Physics Lett. vol. 69 (3), Jul. 15, 1996, pp. 377-379.

Yang et al., Preparation, Characterization and Electroluminescence of ZnS Nanocrystals in a Polymer Matrix, J. Mater. Chem., 1997, 7(1), pp. 131-133.

Yang et al., Electroluminescence from ZnS/CdS Nanocrystals/Polymer Composite, Synthetic Metals 91, (1997) 347-349.

* cited by examiner

METHOD AND STRUCTURE FOR FORMING MODULE USING A POWDER COATING AND THERMAL TREATMENT PROCESS

CROSS-REFERENCES TO RELATED APPLICATIONS

This application claims priority to U.S. Provisional Patent Application No. 61/030,552, filed Feb. 21, 2008, commonly assigned, incorporated herein by reference for all purposes.

BACKGROUND OF THE INVENTION

The present invention relates generally to photovoltaic materials. More particularly, the present invention provides a method and structure for manufacture of a solar module using a powder coating and thermal treatment process for thin and thick film photovoltaic materials. Merely by way of example, the present method and structure have been implemented using a solar module having multiple thin film materials, but it would be recognized that the invention may have other configurations.

From the beginning of time, human beings have been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important source. Petrochemical energy includes gas and oil. Gas includes lighter forms such as butane and propane, commonly used to heat homes and serve as fuel for cooking Gas also includes gasoline, diesel, and jet fuel, commonly used for transportation purposes. Heavier forms of petrochemicals can also be used to heat homes in some places. Unfortunately, petrochemical energy is limited and essentially fixed based upon the amount available on the planet Earth. Additionally, as more human beings begin to drive and use petrochemicals, it is becoming a rather scarce resource, which will eventually run out over time.

More recently, clean sources of energy have been desired. An example of a clean source of energy is hydroelectric power. Hydroelectric power is derived from electric generators driven by the force of water that has been held back by large dams such as the Hoover Dam in Nevada. The electric power generated is used to power up a large portion of Los Angeles Calif. Other types of clean energy include solar energy. Specific details of solar energy can be found throughout the present background and more particularly below.

Solar energy generally converts electromagnetic radiation from our sun to other useful forms of energy. These other forms of energy include thermal energy and electrical power. For electrical power applications, solar cells are often used. Although solar energy is clean and has been successful to a point, there are still many limitations before it becomes widely used throughout the world. As an example, one type of solar cell uses crystalline materials, which form from semiconductor material ingots. These crystalline materials include photo-diode devices that convert electromagnetic radiation into electrical current. Crystalline materials are often costly and difficult to make on a wide scale. Additionally, devices made from such crystalline materials have low energy conversion efficiencies. Other types of solar cells use "thin film" technology to form a thin film of photosensitive material to be used to convert electromagnetic radiation into electrical current. Similar limitations exist with the use of thin film technology in making solar cells. That is, efficiencies are often poor. Additionally, film reliability is often poor and cannot be used for extensive periods of time in conventional environmental applications. There have been attempts to form heterojunction cells using a stacked configuration. Although somewhat successful, it is often difficult to match currents between upper and lower solar cells. These and other limitations of these conventional technologies can be found throughout the present specification and more particularly below.

From the above, it is seen that improved techniques for manufacturing photovoltaic materials and resulting devices are desired.

BRIEF SUMMARY OF THE INVENTION

According to the present invention, techniques related to photovoltaic materials are provided. More particularly, the present invention provides a method and structure for manufacture of a solar module using a powder coating and thermal treatment process for thin and thick film photovoltaic materials. Merely by way of example, the present method and structure have been implemented using a solar module having multiple thin film materials, but it would be recognized that the invention may have other configurations.

In a specific embodiment, the present invention provides a solar module including a substrate having a surface region. The solar module also includes a photovoltaic material overlying the surface region and a barrier material overlying the photovoltaic material. Additionally, the solar module includes a powder coating overlying the barrier material and enclosing the photovoltaic material to mechanically protect the photovoltaic material. In a preferred embodiment, the powder coating is provided by a spraying process using an electrostatic nozzle.

In another specific embodiment, the present invention provides a method of forming a solar module. The method includes providing a substrate member having a surface region. Additionally, the method includes forming a photovoltaic film overlying the surface region. The photovoltaic film includes one or more layers of N-type photosensitive semiconductor material alternatively and respectively overlying one or more layers of P-type photosensitive semiconductor material. The method further includes forming a barrier layer overlying the photovoltaic film. Moreover, the method includes forming a powder coating overlying the barrier layer and enclosing the photovoltaic film to protect the photovoltaic film. The method further includes performing a thermal treatment process to cure the powder coating. Furthermore, the method includes sealing the powder coating.

Depending upon the specific embodiment, one or more of these features may also be included. The present technique provides an easy to use process that relies upon conventional technology that is nanotechnology based. In some embodiments, the method may provide higher efficiencies in converting sunlight into electrical power using a multiple junction design and method. Depending upon the embodiment, the efficiency can be about 10 percent or 20 percent or greater. Additionally, the method provides a powder coating and thermal treatment process that is compatible with conventional technology without substantial modifications to conventional equipment and processes. In a specific embodiment, the present method and structure can also be provided using large scale manufacturing techniques, which reduce both processing cost and material cost associated with the solar module packaging. In another specific embodiment, the present method and structure can also be provided using any combination of suitable single junction solar cell designs to form top and lower cells, although there can be more than two stacked cells depending upon the embodiment. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques related to photovoltaic materials are provided. More particularly, the present invention provides a method and structure for manufacture of a solar module using a powder coating and thermal treatment process for thin and thick film photovoltaic materials. Merely by way of example, the present method and structure have been implemented using a solar module having multiple thin film materials, but it would be recognized that the invention may have other configurations.

Figure 1:
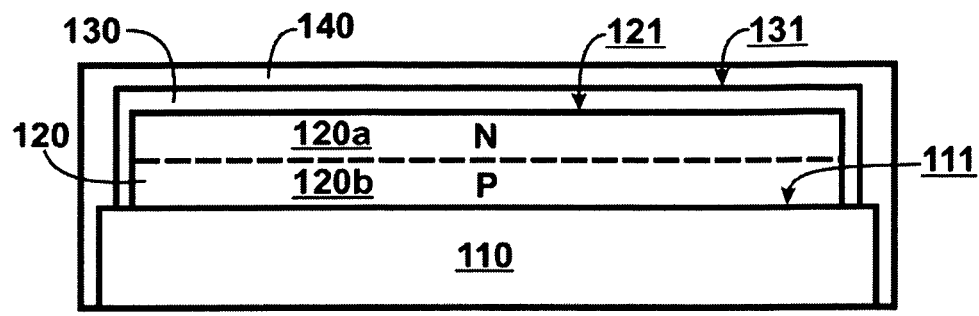
FIG. 1 is a simplified diagram showing a solar module formed using a powder coating and thermal treatment process according to an embodiment of the present invention.

FIG. 1 is a simplified diagram showing a solar module formed using a powder coating and thermal treatment process according to an embodiment of the present invention. This diagram is merely an example, which should not unduly limit the scope of the claims herein. One of ordinary skill in the art would recognize many variations, alternatives, and modifications. As shown, the simplified solar module includes a substrate 110 having a surface region 111. The substrate member can be made of an insulator material, a conductor material, or a semiconductor material, depending on the application. In a specific embodiment, the conductor material can be nickel, molybdenum, aluminum, or a metal alloy such as stainless steel and the likes. In a specific embodiment, the semiconductor material may include silicon, germanium, silicon germanium, compound semiconductor material such as III-V materials, II-VI materials, and others. In a specific embodiment, the insulator material can be a transparent material such as glass, quartz, fused silica, and the like. Alternatively, the insulator material can be a polymer material, a ceramic material, or a layer material or a composite material depending on the application. The polymer material may include acrylic material, polycarbonate material, and others, depending on the embodiment. Of course, there can be other variations modifications, and alternatives.

As shown in FIG. 1, a photovoltaic material 120 is illustrated as a simplified thin film overlaid the surface region 111, including at least a N-type semiconductor layer 120a over a N-type semiconductor layer 120b. In a specific embodiment, the P-type semiconductor layer 120b directly overlays the surface region 111 and N-type semiconductor layer 120a overlays the P-type semiconductor layer 120b, forming a P-N junction. More specifically, the P or N type layer may be added, either on top or below, with one or more conductor layers. In another specific embodiment, the photovoltaic material 120 can be a multiple layers of P and N type semiconductor (and associated conductor layers) formed alternatively forming multiple P-N junctions that can be mutually coupled. In certain embodiments, either the P-type semiconductor layer 120a or the N-type semiconductor layer 120b comprises a thin film made by silicon, or germanium, or III-V group semiconductor, or copper indium diselenide (CIS), or Copper Indium Gallium Selenide (CIGS), or Cadmium Telluride (CdTe), or metal oxide bearing semiconductor property, or nanostructured material. In one embodiment, layer 120a and 120b can have the same composition with different doping polarity. In other embodiments, layer 120a and 120b can have different material composition. In a specific embodiment, the photovoltaic material 120 is coupled to one or more electrode layers (not shown) which can be made of a suitable material or a combination of materials of indium tin oxide (ITO), aluminum doped zinc oxide, fluorine doped tin oxide, and metal materials including gold, silver, nickel, platinum, aluminum, tungsten, molybdenum, a combination of these, or an alloy, among others.

In another specific embodiment, the photovoltaic material 120 can be a thin film metal oxide bearing semiconductor materials formed using at least one or a combination of several techniques selected from a deposition, a chemical reaction, a printing, a spraying, and a plating. The deposition technique further may include sputtering, spin coating, doctor blading, powder coating, electrochemical deposition, inkjeting, among others, depending on the application. Combined photovoltaic material 120 with the corresponding electrode form a basic elements of a photovoltaic cell. More detailed structural and functional information about the photovoltaic cell can be found in a co-assigned U.S. Patent Application No. 60/988,099 titled "THIN FILM METAL OXIDE BEARING SEMICONDUCTOR MATERIAL FOR MULTI-JUNCTION SOLAR CELL DEVICES" by Howard W. H. Lee filed at Nov. 14, 2007. Of course, there can be other variations modifications, and alternatives.

Referring to FIG. 1 again, the simplified solar module also includes a barrier layer 130 overlying a surface 121 of the photovoltaic material 120. The barrier layer serves to prevent diffusion of external material into the respective photovoltaic cells in high temperature processing steps and confine the electrons in electrode layers associated with the photovoltaic cells. In one embodiment, the barrier layer 130 is made of material selected from SiN, or $SiO_2$, or TiN, or TFO. Of course, there can be other variations modifications, and alternatives.

Overlying a surface 131 of the barrier layer 130, the simplified solar module includes a coating 140 to enclose the photovoltaic material therein. In one embodiment, the coating can be formed using spin-on-glass technique. In a preferred embodiment, the coating 140 is made by powder coating using electrostatic nozzle. In an specific embodiment, the coating 140 comprises a composition of TFO (tetrafluorooxetane) fluorine doped $SnO_2$ with a thickness ranging from 10 µm to a few millimeters for providing protection of the photovoltaic cell against various chemical corrosion, UV exposure damage, and resistance to temperature change and mechanical abrasion. For example, the powder coating materials can be provided by AKZO Nobel Corporation or BASF Corporation. In another specific embodiment, the thickness of the coating 140 can be controlled in a wide range from 10 nm to a few millimeters, depending on specific application, by using an electrostatic spraying process based on the coating materials in a solid, solvent-free, powder form. The coating 140 can also at least partially enclose the substrate 110.

In addition, after applied the powder coating overlying the simplified solar module can be further hermetically sealed using an encapsulating material for module packaging. The module packaging includes framing the module by incorporating it with bottom or top glass and coupling electric connectors to the electrodes associated with each photovoltaic cell. The description of electric coupling involved with multi junction photovoltaic cells can be seen in a co-assigned U.S. Patent Application No. 60/988,099 titled "THIN FILM METAL OXIDE BEARING SEMICONDUCTOR MATERIAL FOR MULTI-JUNCTION SOLAR CELL DEVICES" by Howard W. H. Lee filed at Nov. 14, 2007. In one embodiment, the framing of the solar module can have no top glass and EVA encapsulation if the powder coating is applied. In another embodiment, the stiffener may be added when 3 mm glass is used. Multiple cells can be further linked through the electric connectors and specific mechanical structures to form various solar panels or systems depending on applications.

Figure 3:
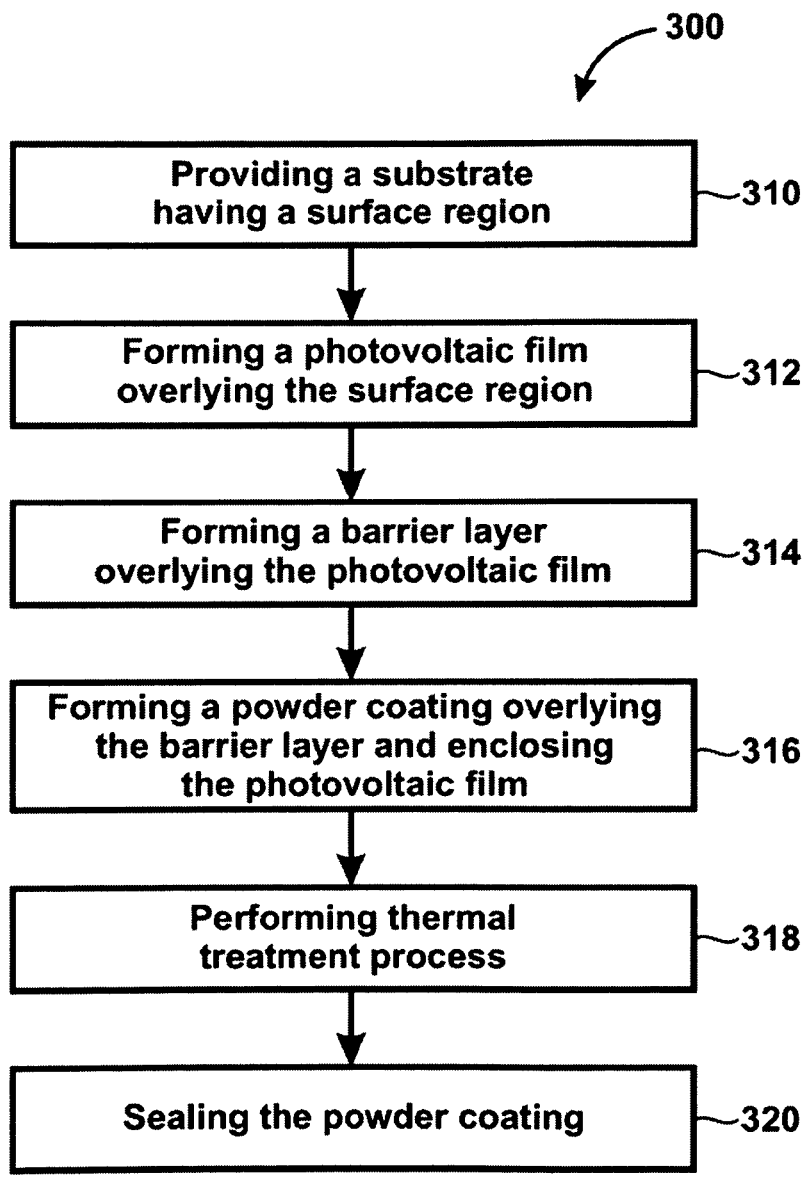
FIG. 3 is a simplified flowchart showing a method of forming a solar module according to an embodiment of the present invention.

FIG. 3 is a simplified flowchart showing a method of forming a solar module according to an embodiment of the present invention. This diagram is merely an example, which should not unduly limit the scope of the claims herein. The method 300 includes the following processes:

1. Process 310 for providing a substrate having a surface region;
2. Process 312 for forming a photovoltaic film overlying the surface region;
3. Process 314 for forming a barrier layer overlying the photovoltaic film;
4. Process 316 for forming a powder coating overlying the barrier layer and enclosing the photovoltaic film;
5. Process 318 for performing a thermal treatment process; and
6. Process 320 for sealing the powder coating.

The above sequence of processes provides a method for forming a solar module using a powder coating and a thermal treatment process according to an embodiment of the present invention. Other alternatives can also be provided where processes are added, one or more processes are removed, or one or more processes are provided in a different sequence without departing from the scope of the claims herein. For example, forming the photovoltaic film can be achieved by using techniques and structures described in an co-assigned U.S. Patent Application No. 60/988,099 titled "THIN FILM METAL OXIDE BEARING SEMICONDUCTOR MATERIAL FOR MULTI-JUNCTION SOLAR CELL DEVICES" by Howard W. H. Lee filed at Nov. 14, 2007. Further details of the method can be found throughout the present specification and more particularly below.

Figure 2A:
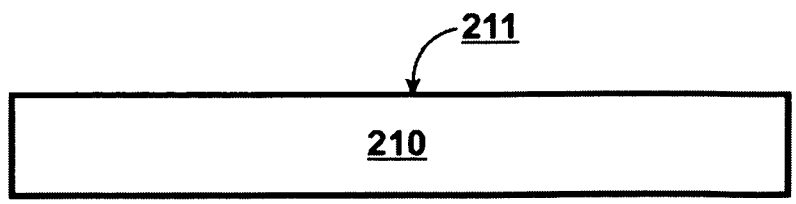
FIG. 2A-2F are simplified diagrams showing a sequence of processes of forming a solar module using powder coating according to an embodiment of the present invention.

At the process 310, a substrate having a surface region is provided. FIG. 2A shows a simplified process 310 for forming the solar module according to an embodiment of the present invention. This diagram is merely an example, which should not unduly limit the scope of the claims. One of ordinary skill in the art would recognize many variations, alternatives, and modifications.

As shown in FIG. 2A, a substrate 210 having a surface 211 is provided for forming the solar module. For example, the substrate member can be made of an insulator material, a conductor material, or a semiconductor material, depending on the application. In a specific embodiment, the conductor material can be nickel, molybdenum, aluminum, or a metal alloy such as stainless steel and the likes. In a specific embodiment, the semiconductor material may include silicon, germanium, silicon germanium, compound semiconductor material such as III-V materials, II-VI materials, and others. In a specific embodiment, the insulator material can be a transparent material such as glass, quartz, fused silica, and the like. Alternatively, the insulator material can be a polymer material, a ceramic material, or a layer material or a composite material depending on the application. The polymer material may include acrylic material , polycarbonate material, and others, depending on the embodiment. Of course, there can be other variations modifications, and alternatives.

Figure 2B:
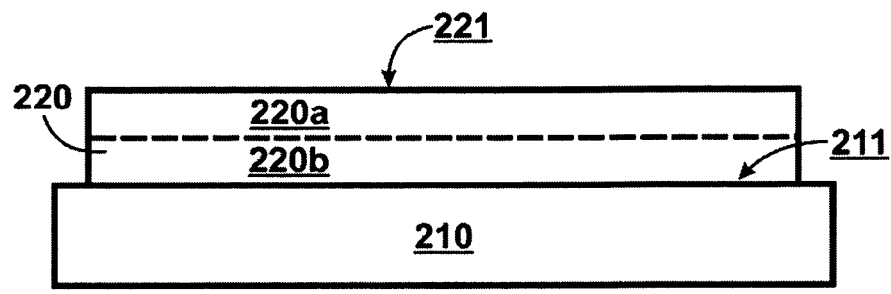

At the process 312, a photovoltaic film is formed overlying the surface region. FIG. 2B shows a simplified process 312 for forming the solar module according to an embodiment of the present invention. This diagram is merely an example, which should not unduly limit the scope of the claims. One of ordinary skill in the art would recognize many variations, alternatives, and modifications.

As shown in FIG. 2B, a photovoltaic film 220, as a simplified version, including at least a layer 220a and a over a layer 220b is formed on the surface 211 as a photovoltaic cell. The layer 220b serves as an absorber layer characterized by a P type impurity characteristics. The absorber layer absorbs electromagnetic radiation forming positively charged carriers. The layer 220a serves as a window layer having a $N^+$ impurity type characteristics. Both the P-type and N-type layers comprises essentially semiconductor in their electric property. For example, this layer can be made of element semiconductor of group IV, or compound semiconductor of group III-V or group II-VI, or copper indium diselenide (CIS), or Copper Indium Gallium Selenide (CIGS), or Cadmium Telluride (CdTe), or metal oxide bearing semiconductor property, or nanostructured material. In an specific embodiment, the layer 220a or 220b can be a metal chalcogenide semiconductor material characterized by a bandgap ranging from about 0.7 eV to about 1.2 eV. In another specific embodiment, the layer 220a and 220b can be deposited using techniques such as sputtering, spin coating, doctor blading, powder coating, electrochemical deposition, inkjeting, among others, depending on the application. In another specific embodiment, the photovoltaic film 220 also includes one or more electrode layers (not shown) coupled to the absorber layer and the window layer respectively. The one or more electrode layers are conductive and optical transparent, made of one or a combination of materials of indium tin oxide (ITO), aluminum doped zinc oxide, fluorine doped tin oxide, and metal materials including gold, silver, nickel, platinum, aluminum, tungsten, molybdenum, a combination of these, or an alloy, among others.

Figure 2C:
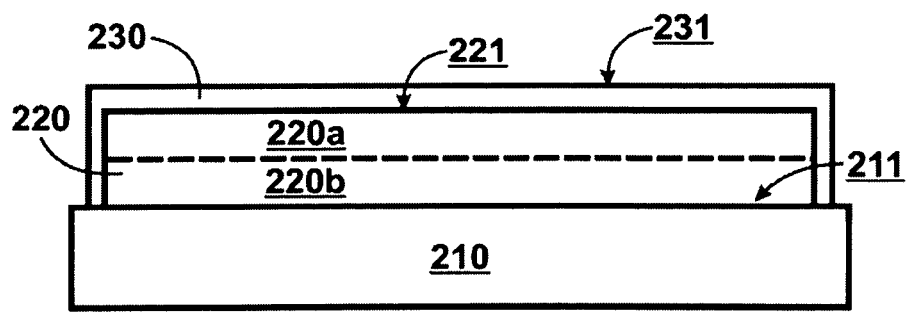

At the process 314, a barrier layer is formed overlying the photovoltaic film. FIG. 2C shows a simplified process 314 for forming the solar module according to an embodiment of the present invention. This diagram is merely an example, which should not unduly limit the scope of the claims. One of ordinary skill in the art would recognize many variations, alternatives, and modifications.

As shown in FIG. 2C, a barrier layer 230 is formed overlying the photovoltaic film or photovoltaic cell 220. The barrier layer 230 is intended for preventing the photovoltaic material including conductive electrode layer from diffusing to outer layer (to be formed later) during one or more thermal treatment processes later. The barrier layer also can help to confine the photon-induced electrons within the conductive electrode layer (not shown in FIGS. 2B-2C) during the working period of the photovoltaic cells. For example, the barrier layer can be made of one material or certain combinations of a group selected from SiN, or $SiO_2$, or TiN, or TFO (tetrafluorooxetane) characterized by a resistivity greater than about 10 kohm-cm. The techniques for forming such the barrier layer includes a deposition, a chemical reaction, a painting, a printing, a spraying, sputtering, or a plating. In one embodiment, the barrier layer also serves as a primer for the coating to be applied in a subsequent process. Of course, there can be many variations, alternatives, and modifications.

Figure 2D:
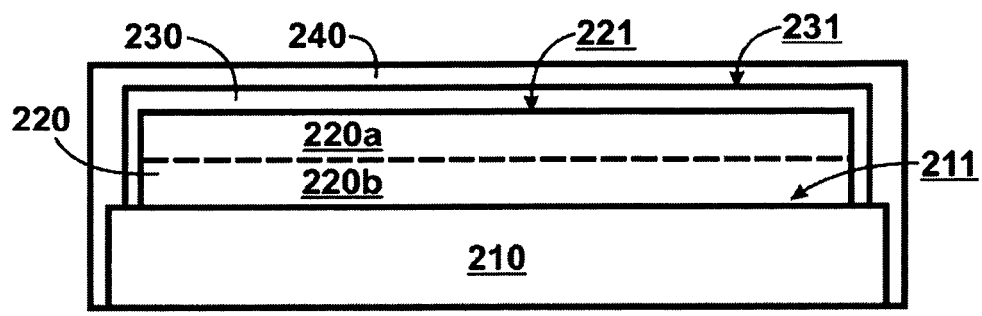

At the process 316, a powder coating is formed overlying the barrier layer and enclosing the photovoltaic film. FIG. 2D shows a simplified process 316 for forming the solar module according to an embodiment of the present invention. This diagram is merely an example, which should not unduly limit the scope of the claims. One of ordinary skill in the art would recognize many variations, alternatives, and modifications.

Referred to FIG. 2D, a protective coating 240 made by powder coating technique overlays the barrier layer 230 and encloses the photovoltaic film or cell 220 therein. In one embodiment, the coating 240 comprises a thickness in a wide range from about 10 nm to about 3 mm of one or more materials with composition of TFO fluorine doped $SnO_2$, providing protection of the photovoltaic cell against various chemical corrosion, UV exposure damage, and resistance to temperature change and mechanical abrasion. For example, the powder coating material can be provided by AKZO Nobel Corporation or BASF Corporation. In another embodiment, the powder coating material is made into solid, solvent-free fine power form and is applied using an electrostatic spraying process. The thickness control can be easily achieved with this technique using proper sized (with a narrow size distribution) powder particles. It can be applied with a single-layer coating or multiple layer with a primer being applied first. In a specific embodiment, the powder coating is applied at a substrate temperature from room temperature to less than 500 Degrees Celsius. For example, the powder coating is applied using an electrostatic spraying process. Filtered, compressed air, usually at 100-200 kPa is applied to push the powder particles out of an electrostatic nozzle or gun past an electrode which gives the powder particles positive charges. The sample being coated with the primer barrier is grounded so the positive powder particles are attracted to it. In case without primer barrier layer before applying the powder coating, certain surface pretreatment may be needed. For example, the sample to be coated needs to be preheated to obtain desired powder particle adhesion result. Of course, there can be many variations, alternatives, and modifications.

Figure 2E:
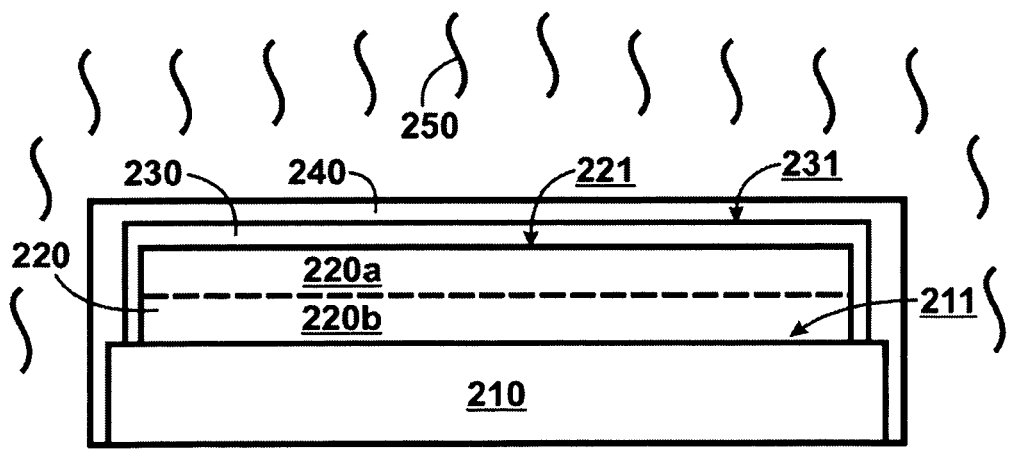

At the process 318, a thermal treatment process is performed to cure the applied powder coating. FIG. 2E shows a simplified process 318 for forming the solar module according to an embodiment of the present invention. This diagram is merely an example, which should not unduly limit the scope of the claims. One of ordinary skill in the art would recognize many variations, alternatives, and modifications.

As shown in FIG. 2E, thermal radiation 250 is uniformly applied to the solar module formed with powder coating. In one embodiment, the thermal treatment process allows the electrostatic applied powder coating to be cured or solidified and densified and shrunken to a final desired film thickness. Usually, the thermal treatment process is conducted in a temperature controlled oven. For example, a conventional direct-fired or indirect-fired oven, infrared oven, or induction oven can be used. In another example, the thermal treatment process for curing the powder coating can be performed at relative low temperature between 100 to 400 Degree of Celsius in 10 minutes or less. In certain embodiments, the curing process can be a multistage heat treatment with various cycle time or ramping rate. Depending on the particle size and size distribution, proper particle melting and cross-linking processes within certain time period during the thermal treatment determines the quality of the cured coating so that the resulted coating contains substantially free of bubbles and pin-holes. Certain testing methods can be applied during or after the thermal treatment process for determining the desired thermal treatment process parameters. For example, the testing methods include thickness measurement, color checking, various hardness tests, and corrosion resistance tests.

At the process 320, the solar module with power coating can be sealed with an encapsulating material. FIG. 2E shows a simplified process 320 for forming the solar module according to an embodiment of the present invention. This diagram is merely an example, which should not unduly limit the scope of the claims. One of ordinary skill in the art would recognize many variations, alternatives, and modifications.

Figure 2F:
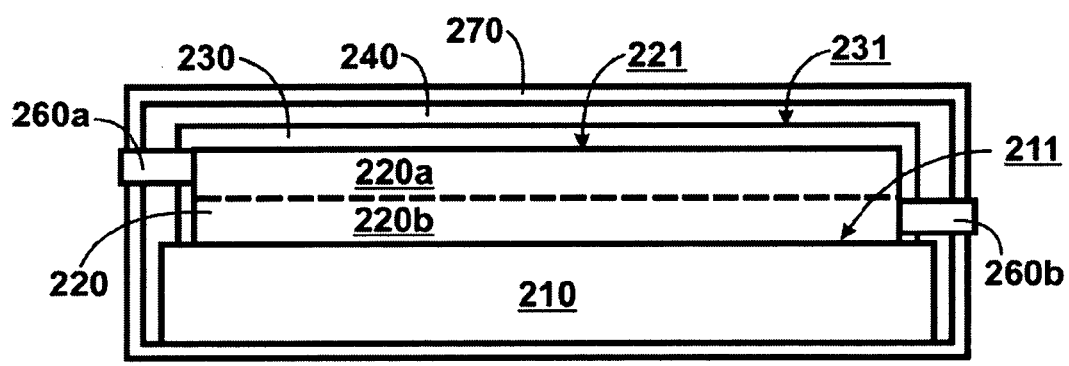

As shown in FIG. 2F, the solar module overlying with the cured powder coating is sealed. In one embodiment, sealing is provided with an encapsulating material 270 overlying the cured powder coating 240. The encapsulating material can be selected from EVA (ethylene vinyl acetate), PVA material, acrylic, paint, reflowable glass, or sol gel. One of multiple functions of the encapsulating material is for framing the module with glass or plastic cover into a solar panel or system. It should be characterized by strong adhesion and optical transparence or index matching properties. Another function of the encapsulating material serves as further protecting layer for the module against environment moisture impact when applied in field. In certain application, solar module needs to be sealed hermetically, while keeping photovoltaic cell electrical terminal to connect with electric connectors which respectively couples with the corresponding electrode layers of the photovoltaic cell. For example, these electric connectors 260a and 260b are configured to penetrate the overlying encapsulating material, or powder coating, or barrier layer at one or more predetermined locations so that the photovoltaic cells can be electrically cross-linked to each other. Furthermore, these connectors 260a and 260b can be used to link module to module and further form a big solar panel or system merged into electric network.

It is also understood that the examples and embodiments described herein are for illustrative purposes only and that various modifications or changes in light thereof will be suggested to persons skilled in the art. For example, embodiments according to the present invention have been described for forming a solar module using a powder coating and thermal treatment process. The description of the photovoltaic cell structure associated with the solar module can be further found in a co-assigned U.S. Patent Application No. 60/988,099 titled "THIN FILM METAL OXIDE BEARING SEMICONDUCTOR MATERIAL FOR MULTI-JUNCTION SOLAR CELL DEVICES " by Howard W. H. Lee filed at Nov. 14, 2007. But, ordinary skilled in the art should recognize that many variations of the thin-film photovoltaic cell structures can be still applied by the present invention. Various modifications and changes can be included within the spirit and purview of this application and scope of the appended claims.

What is claimed is:

1. A method of forming a solar module, the method comprising:
   providing a substrate member having a surface region;
   forming a photovoltaic film overlying the surface region, the photovoltaic film comprising one or more layers of N-type photosensitive semiconductor material alternatively and respectively overlying one or more layers of P-type photosensitive semiconductor material;
   forming a barrier layer overlying and enclosing the photovoltaic film on the top and side surfaces;
   forming a powder coating overlying the barrier layer and enclosing the photovoltaic film to protect the photovoltaic film, wherein the powder coating consists of a tetrafluorooxetane fluorine-doped $SnO_2$;

performing a thermal treatment process to cure the powder coating; and sealing with an encapsulating material over the powder coating wherein the barrier layer comprises SiN, or SiO2, or TiN, or TFO.

2. The method of claim 1 wherein the forming a photovoltaic film overlying the surface region comprises at least a process selected from a deposition, a chemical reaction, a painting, a printing, a spraying, sputtering, and a plating.

3. The method of claim 1 wherein the P-type or N-type photosensitive material comprises silicon or germanium, or compound semiconductor of group III-V or II-VI, or copper indium diselenide (CIS), or Copper Indium Gallium Selenide (CIGS), or Cadmium Telluride (CdTe), or metal oxide bearing semiconductor material, or nanostructured material.

4. The method of claim 1 wherein forming the powder coating is performed at a temperature from room temperature to less than 500 Degrees Celsius.

5. The method of claim 1 wherein the powder coating comprises a thickness ranging from about 10 nm to about 3 mm.

6. The method of claim 1 wherein forming a powder coating overlying the barrier layer comprises using an electrostatic nozzle to spray a plurality of charged powder particles on the substrate being electrically grounded.

7. The method of claim 1 wherein performing the thermal treatment process comprises a temperature ranging from 100 to 400 Degrees Celsius applied for 10 minutes or less, so that the cured powder coating is substantially free of bubbles and pin-holes.

8. The method of claim 1 wherein the encapsulating material comprises one or more materials selected from EVA, PVA, paint, reflowable glass, or sol gel.

* * * * *